(12) United States Patent
Lu et al.

(10) Patent No.: US 8,563,417 B2
(45) Date of Patent: Oct. 22, 2013

(54) METHOD FOR PACKAGING ULTRA-THIN CHIP WITH SOLDER BALL THERMO-COMPRESSION IN WAFER LEVEL PACKAGING PROCESS

(75) Inventors: Jun Lu, San Jose, CA (US); Alex Niu, Songjiang (CN); Yueh-Se Ho, Sunnyvale, CA (US); Ping Hoang, Songjiang (CN); Jacky Gong, Songjiang (CN); Yan Xun Xue, Los Gatos, CA (US); Xiaolian Zhang, San Jose, CA (US); Ming-Chen Lu, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 55 days.

(21) Appl. No.: 13/302,219

(22) Filed: Nov. 22, 2011

(65) Prior Publication Data

US 2013/0130443 A1 May 23, 2013

(51) Int. Cl.
*H01L 21/78* (2006.01)
(52) U.S. Cl.
USPC ............................. 438/613; 257/738; 438/616
(58) Field of Classification Search
USPC ................... 257/738, E21.508; 438/613, 616
See application file for complete search history.

(56) References Cited

U.S. PATENT DOCUMENTS

| | | | | |
|---|---|---|---|---|
| 5,956,605 A | * | 9/1999 | Akram et al. | 438/613 |
| 6,916,687 B2 | * | 7/2005 | Ho et al. | 438/120 |
| 2002/0058403 A1 | * | 5/2002 | Farnworth | 438/613 |
| 2002/0177295 A1 | * | 11/2002 | Tsukui et al. | 438/613 |
| 2008/0050901 A1 | * | 2/2008 | Kweon et al. | 438/597 |

* cited by examiner

*Primary Examiner* — Peniel M Gumedzoe
(74) *Attorney, Agent, or Firm* — Chein-Hwa Tsao; CHEmily LLC (57) ABSTRACT

The invention generally relates to a packaging method of an ultra-thin chip, more specifically, the invention relates to a method for packaging the ultra-thin chip with solder ball thermo-compression in wafer level packaging process. The method starts with disposing solder balls on metal pads arranged on the front surface of semiconductor chips that are formed at the front surface of a semiconductor wafer. The solder balls are soften by heating the wafer, a compression plate is applied with a pressure on the top ends of the solder balls thus forming a co-planar top surface at the top ends of the solder balls. A molding compound is deposited on the front surface of the wafer with the top ends of the solder balls exposed. The wafer is then ground from its back surface to reduce its thickness to achieve ultra-thin chip.

14 Claims, 6 Drawing Sheets

METHOD FOR PACKAGING ULTRA-THIN CHIP WITH SOLDER BALL THERMO-COMPRESSION IN WAFER LEVEL PACKAGING PROCESS

FIELD OF THE INVENTION

The invention generally relates to a packaging method of an ultra-thin chip, more specifically, the invention relates to a method for packaging the ultra-thin chip with solder ball thermo-compression in wafer level packaging process.

BACKGROUND OF THE INVENTION

Wafer level packaging (WLP) is the technology of packaging an integrated circuit (IC) at wafer level, and then single IC is singulated by wafer dicing. WLP is essentially a true chip scale package (CSP) since the resulting package is practically of the same size as the original semiconductor chip. WLP is capable of forming smaller packaging size with better electrical performance. Furthermore, WLP is a simple process, including chip packaging and test with a reduced overall production cost.

Figure 1A:
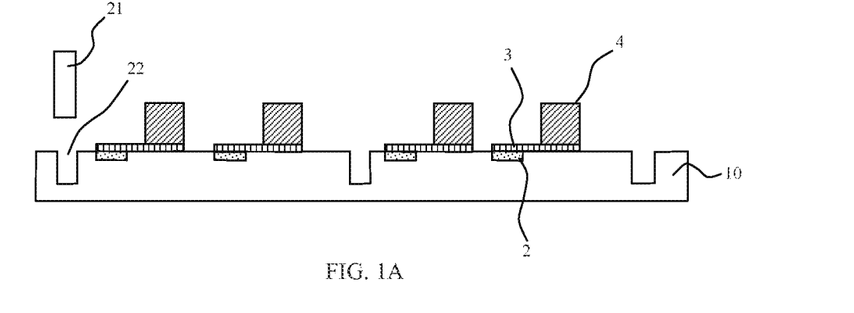
FIGS. 1A-1D are cross-sectional views illustrating wafer level packaging method of prior art.
Figure 1B:
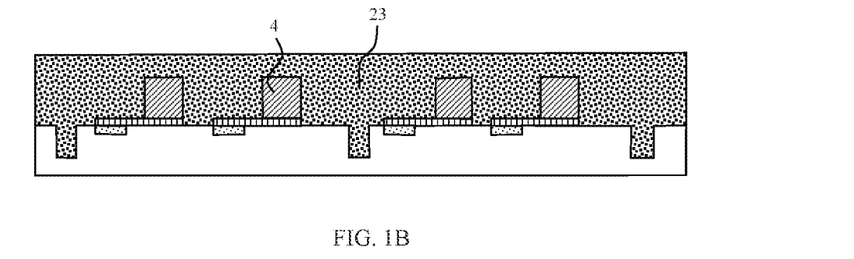
Figure 1C:
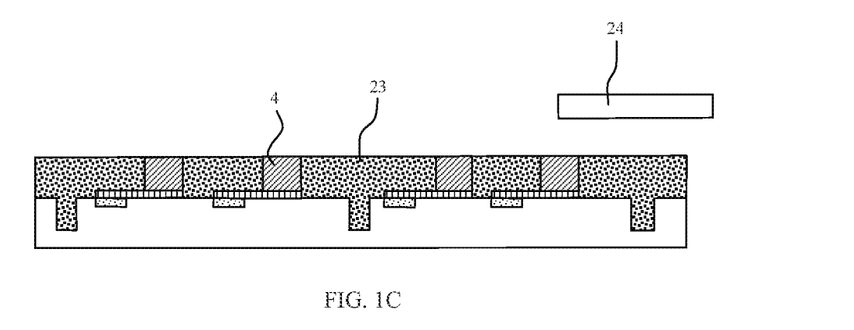
Figure 1D:
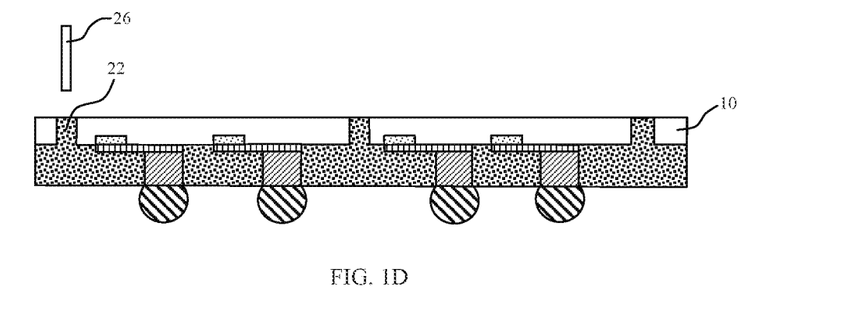

U.S. Pat. No. 6,107,164 discloses a wafer level packaging method, which is shown in FIGS. 1A-1D. As shown in FIG. 1A, a wafer 10 includes semiconductor chips at its front surface with an electrode metal pad 2 connected to electrode bump 4 via a copper interconnection or wire 3. Groove 22 is formed between two adjacent semiconductor chips by cutting the wafer 10 via a blade 21 to a depth deeper than half the thickness of the wafer 10. The front surface of the wafer 10 and the electrode bump 4 are covered with a layer of resin 23, as shown in FIG. 1B, with the resin 23 fully encapsulating the electrode bump 4. As shown in FIG. 1C, the resin 23 is then ground and polished by a polishing blade 24 until the electrode bump 4 is exposed from the resin 23. In this process, the top portion of the electrode bump 4 is also ground, therefore both the thickness of the resin 23 and the electrode bump 4 are reduced. As shown in FIG. 1D, the wafer 10 is then ground at its backside and the solder balls are attached on the exposed electrode bump 4. Individual packages are separated by cutting the wafer 10 from its back surface through the groove 22 using a blade 26.

However, during the process for grinding resin 23 and electrode bump 4 by the blade 24, metal dust from grinding the electrode bump 4 is easily to stick to blade 24, thus cause the grinding wheel to stop. As a result, the consistency of the exposed surface area of electrode bumps 4 is hard to control. In addition, some other problems are also generated, for example, the expensive molding compound and process time are wasted, additional processing cost is increased, and etc.

SUMMARY OF THE INVENTION

The present invention discloses a method for packaging an ultra-thin chip with solder ball thermo-compression in wafer level packaging process. The method starts with depositing solder balls on metal pads arranged on the front surface of semiconductor chips that are formed at the front surface of a semiconductor wafer and are spaced apart from each other by scribe lines. Different metal pads have different areas, so that the volume of the solder ball attached on the metal pad of larger area is bigger than the volume of the solder ball attached on the metal pad of smaller area. In case the solder balls have same volume, a number of the solder balls attached on the metal pad of larger area is more than the number of the solder balls attached on the metal pad of smaller area.

The solder balls are soften by heating the wafer from its back surface, front surface or both. The heating temperature is lower than the melting point of the solder ball. Preferably, the heating temperature is about 10° C. to 100° C. lower than the melting point of the solder ball.

A compression plate is placed above or on the top ends of the solder balls and a pressure is applied on the compression plate to the top ends of the solder balls with the compression plate being kept parallel with the wafer during the compression, thus forming a co-planar top surface at the top ends of the solder balls. Alternatively, the compression plate is heated before applying a pressure on it. The compression plate maybe a stainless steel plate, a copper plate, a ceramic plate or a marble plate. During the compression process, the compression plate must slowly moves down with a speed of about 0.01 mm/min to 2 mm/min, preferably 0.2 mm/min.

A molding compound, in powder form or liquid form, is deposited on the front surface of the wafer. At this stage, a release tape is placed on the top surfaces of the wafer and the molding compound followed by heating the molding compound above its melting temperature without melting the solder balls. A pressure is applied on the release tape to make a close contact between the top surface of the solder balls and the molding compound with the release tape to avoid the overflow of the liquid molding compound before it is solidified forming a molding layer covering the front surface of the wafer and surrounding the sidewall of the solder balls with the solder balls exposed from the molding layer. Then, the release tape is removed. The solder balls are slightly ground or polished or brushed to remove and clean the molding compound residue from the top surface of the solder balls.

The wafer is then ground from its back surface to reduce its thickness. A metal layer is thus formed to cover the back surface of the thinned wafer. The wafer, the molding layer and the metal layer are thus cut through at the scribe lines to separate individual chip packages, each of which includes a semiconductor chip with a molding layer covering on the front surface of the chip and surrounding the sidewall of the solder balls attached on the metal pads at the front surface of the chip with the top surface of the solder balls exposed from molding layer, and a metal layer covering the back surface of the wafer.

In one embodiment, the semiconductor chip is a metal-oxide-semiconductor field-effect transistor (MOSFET).

BRIEF DESCRIPTION OF THE DRAWINGS

The embodiments of the invention are better described with referring to the attached drawings. However, the drawings attached are only used for explanations and descriptions, and cannot form limitations to the scope of the invention.

DETAILED DESCRIPTION OF THE EMBODIMENTS

Figure 2A:
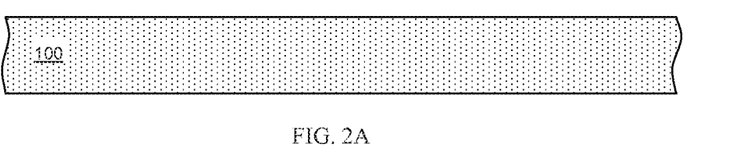
FIGS. 2A-2J are cross-sectional views illustrating the steps of a wafer level packaging method of the present invention.
Figure 2B:
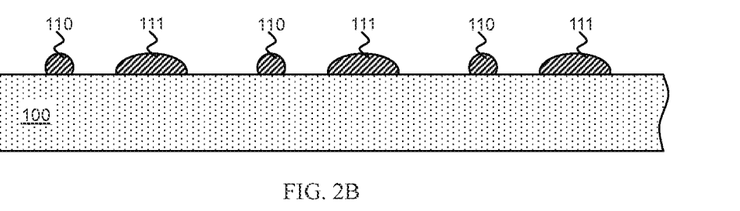

As shown in FIG. 2A, a wafer 100 includes a plurality of semiconductor chips formed on its front surface with two adjacent chips spaced apart by a scribe line, which is well known in the art. As shown in FIG. 2B, solder balls 110, 111 are placed on the corresponding metal pads formed at the front surface of each chip, which are usually used as the electrode of the chip or terminal for signal transmission with the external devices. In FIG. 2B, the volume of the solder ball 110 is different from that of the solder ball 111, because the sizes or shapes of the electrode metal pads are different. As a result, solder balls with bigger volumes are formed on the metal pads of larger areas, and solder balls with smaller volumes are formed on the metal pads of smaller areas. For example, solder paste is placed on the metal pads and then reflowed, thus the volume of the solder ball formed on the metal pad with larger area (such as solder ball 111) is bigger than the volume of the solder ball (such as solder ball 110) formed on the metal pad with smaller area. Alternatively, multiple small solder balls, for example solder balls with the small diameter as the solder ball 110, are formed adjacent and closed to each other on the metal pad with larger area, and then are melted together to form a solder ball with bigger volume, such as solder ball 111, after being heated and softened.

Figure 2C:
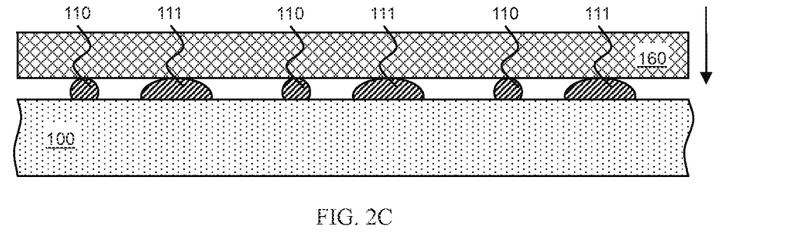

As shown in FIG. 2C, wafer 100 is heated from its back surface, front surface or both to soften all of the solder balls 110 and 111 formed on the metal pads of the chips. The heating temperature is usually slightly lower than the melting point of the solder ball to avoid the solder balls completely melted, for example, the heating temperature can be selected about 10 to 100 lower than the melting point of the solder ball. In addition, heating temperature of the wafer is different for different materials of solder balls. For example, the heating temperature for wafer 100 can be selected between 150 to 300 for PbSn solder balls.

Figure 2D:
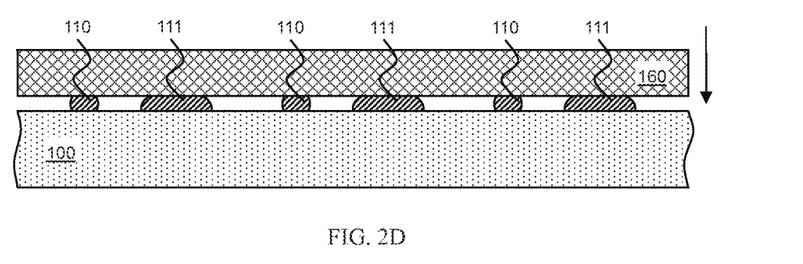

As shown in FIGS. 2C-2D, after the solder balls 110 and 111 are softened, a compression plate 160 is placed above or on the top ends of the solder balls 110 and 111 simultaneously and a pressure is applied on the compression plate to form planar top surface on the top end of the solder balls. During this process, the compression plate 160 must be kept parallel to the wafer surface. In addition, bonding between the compression plate 160 and the softened solder ball is not allowed, therefore the compression plate 160 may be a stainless steel plate, a copper plate, a ceramic plate or marble plate and the like that have no bonding effects on the solder ball. Alternatively, the compression plate made of other material with its surfaces coated with anti-bonding materials, such as Teflon coating, is also applicable. In addition, during the compression process, in which a pressure is applied on the compression plate to the top end of the solder ball, in order to avoid any damage to the surface of the solder ball, the compression plate is pressed towards the wafer's front surface slowly. In one embodiment, when a pressure is applied on the compression plate to the top ends of the solder balls 110 and 111, the movement speed of the compression plate 160 is about 0.01 mm/min to 10 mm/min, and preferably, 0.2 mm/min.

Figure 2E:
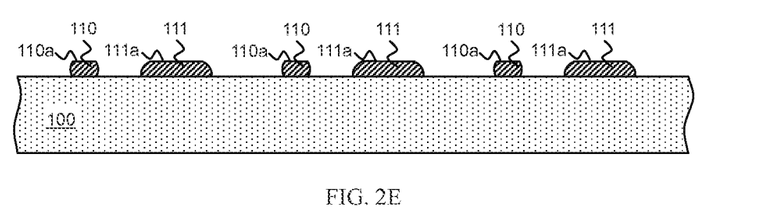

The top ends of the solder balls 110 and 111 are originally of arc shapes with smooth contours, and after applying pressure to the top ends of the solder balls 110 and 111, the top ends of the solder balls 110 and 111 become planar top surface. As shown in FIG. 2E, after the compression plate 160 is removed, the top end of the solder ball 110 is formed into a planar top surface 110a, and the top end of the solder 111 is formed into a planar top surface 111a, therefore the compression plate 160, besides the use for applying a pressure to the top ends of the solder balls, it is also used to ensure that the top surfaces of all solder balls, for example, both the top surface 110a of the solder ball 110 and the top surface 111a of the solder ball 111, are co-planar.

Figure 2F:
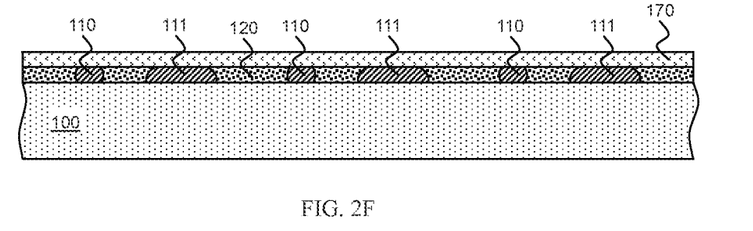
Figure 2G:
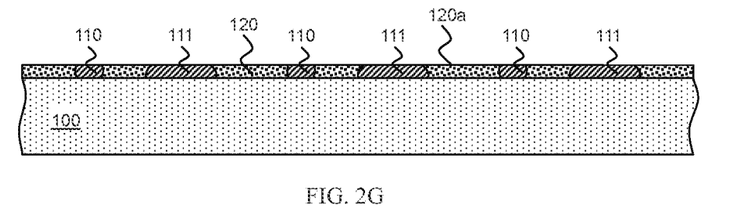

It is well known in the art that, in the wafer level packaging process, the molding step of the wafer is carried out in a packaging place, where a molding compound is deposited on the top surface of the wafer, then a release tape is placed on the top surface of the molding compound and the wafer to avoid direct contact between the molding compound and a top compression plate while compressing the molding compound. As shown in FIG. 2F, during molding process, a molding compound 120, such as epoxy resin and the like, in powder form or liquid form, is deposited on the front surface of the wafer, then a release tape 170 is flatly placed on the top of the molding compound 120 and the wafer 100. The molding compound is heated above its melting temperature without melting the solder balls. A pressure is applied on the release tape 170 to form a molding layer covering the front surface of the wafer and fill in the space between the solder balls 110 and 111 with top surface of the solder balls and the molding compound closely contact with the release tape 170 during the compression to prevent the overflow of the liquid molding compound before it is solidified as shown in FIG. 2F. After finishing the molding process, the release tape 170 is removed as shown in FIG. 2G. The molding layer 120 covers the front surface of wafer 100 and surrounds the sidewalls of the solder balls 110 and 111 with the top surface 110a of the solder ball 110 and the top face 111a of the solder ball 111 exposed out of the molding layer 120. The top surface 110a of the solder ball 110 or the top surface 111a of the solder ball 111 and the top surface 120a of the plastic packaging layer 120 normally are not co-planar after the release tape 170 is removed due to two following reasons. First, since the release tape 170 has a certain flexibility, although the compression of the solder balls 110 and 111 and release tape 170 is not very strong, the solder balls 110 and 111, which are made of metal materials, may be intruded into the release tape 170 in a certain degree, for example the intruded depth is about 0.1 mm, thus after the release tape 170 is removed, the top surface 110a of the solder ball 110 or the top surface 111a of the solder ball 111 is 0.1 mm higher than the top surface 120a of the molding layer 120. In other words, the solder balls 110 and 111 actually contain a bump (not shown) higher than the top surface 120a of the molding layer 120, which is the part of the solder balls 110 and 111 intruded into the release tape. Second, the overflow of the liquid molding compound may cover a portion of the top surface of the solder balls 110 and 111. Therefore, after finishing the molding process, the top surface 120a of the molding layer 120, is lightly ground or polished or brushed to remove and clean the molding compound residue from the top surface of the solder balls Compared with the steps as shown in FIGS. 1B-1C of the conventional method, the top portions of the solder balls 110 and 111 and the molding layer 120 that are ground away is extremely small comparing with the top portion of the resin 23 in the FIGS. 1B-1C to fully expose the bump electrode 4 from the resin 23.

Figure 2H:
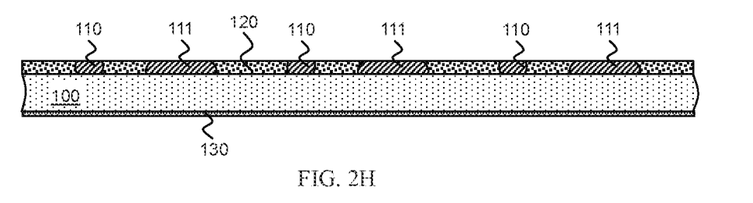

In some applications, it is also required to grind wafer 100 to reduce the thickness of the wafer, thus the molding layer 120 is also used as a support substrate for grinding the wafer to obtain the ultra-thin wafer 100. As shown in FIG. 2H, wafer 100 is ground from its backside to reduce its thickness. In some power devices, the backside of the chip is heavily doped, therefore after finishing grinding the backside of wafer 100 as shown in FIG. 2H, ion is injected into the backside of the thinned wafer 100 followed by annealing and then depositing a metal layer 130 covering the backside of the thinned wafer 100.

Figure 2I:
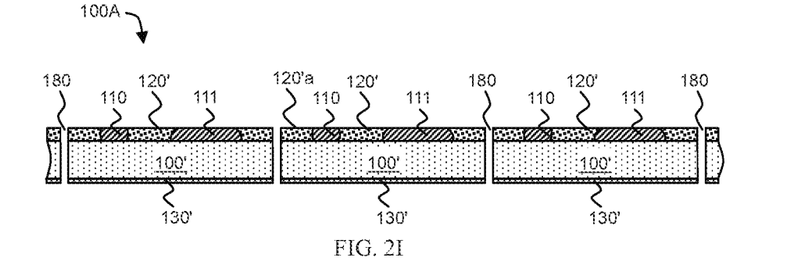

As shown in FIG. 2I, the wafer 100, the molding layer 120 and the metal layer 130 are cut along the scribe line 180 forming multiple individual chip packages 100A, each of which includes a semiconductor chip 100', a molding layer 120' covering the front surface of chip 100' and a bottom metal layer 130' located at the backside of the chip 100'. The chip package 100A also includes solder balls 110 and 111 attached on the metal pads at the front surface of chip 100' with the top surfaces 110a and 111a of the solder balls 110 and 111 exposed form the molding layer 120'.

Figure 2J:
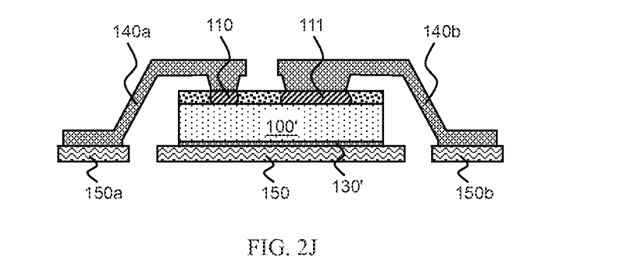

As shown in FIG. 2J, the bottom metal layer 130' of the chip package 100A is attached on a die paddle 150 of a lead frame via conductive materials, while the solder balls 110 and 111 are electrically connected to pin 150a and pin 150b arranged near the die paddle 150 via metal clip 140a and metal clip 140b. The chip package 100A with the die paddle 150, pins 150a and 150b and metal clips 140a and 140b are then encapsulated by a second molding compound (not shown).

Figure 3A:
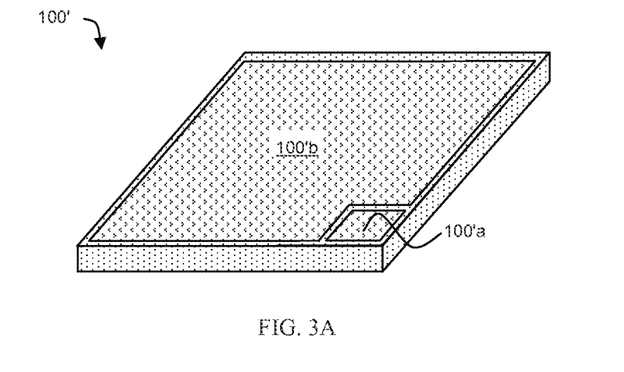
FIG. 3A is a perspective view illustrating a vertical power MOSFET.
Figure 3B:
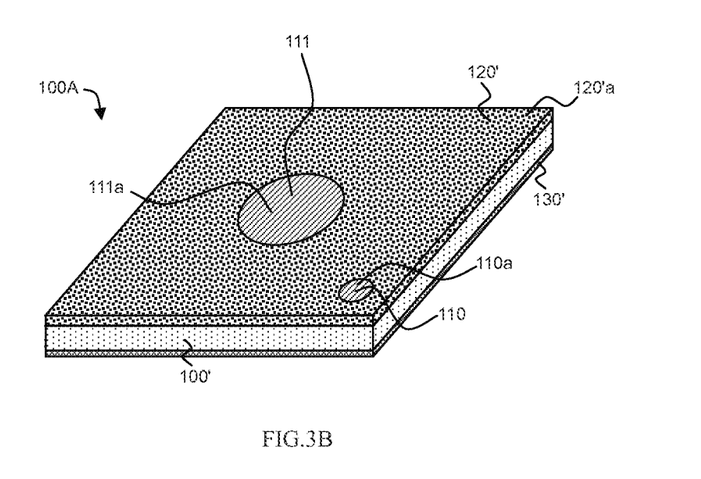
FIG. 3B is a perspective view of a chip package formed by the method of the present invention.

FIG. 3A is a perspective view illustrating the structure of the chip 100' shown in FIG. 2I. Because a plurality of semiconductor chips 100' are formed at the front surface of the wafer 100, when the thickness of the wafer 100 is reduced, the thickness of the chip 100' is also reduced. In one embodiment, the chip 100' may be a vertical power MOSFET device, and the front surface of the chip 100' is provided with a metal pad 100'a and a metal pad 100'b insulated from each other with the metal pad 100'a formed on the gate electrode of chip 100', and the metal pad 100'b formed on the source electrode of the chip 100'. The area of the metal pad 100'b is, than that of the metal pad 100'a, therefore the volume of the solder ball attached on the metal pad 100'b is bigger than the volume of the solder ball attached on the metal pad 100'a. FIG. 3B is a perspective view illustrating the chip package 100A (shown in FIG. 2I) including the chip 100' shown in FIG. 3A. The bottom meal layer 130' is formed on the drain electrode of chip 100'. As shown in 3B, the solder ball 111 with a bigger volume is attached on the metal pad 100'b, while the solder ball 110 with a smaller volume is attached on the metal pad 100'a.

Figure 4A:
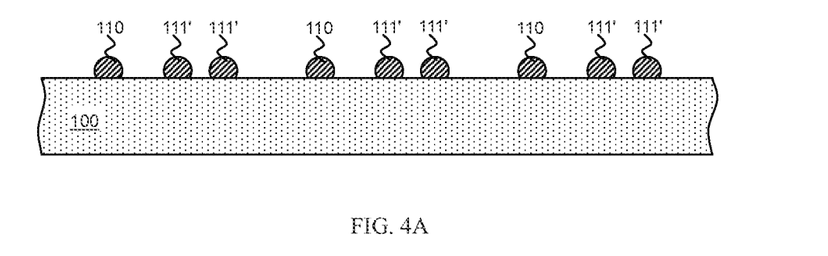
FIGS. 4A-4B are cross-sectional views illustrating the alternating steps of the wafer level packaging method of the present invention.
Figure 4B:
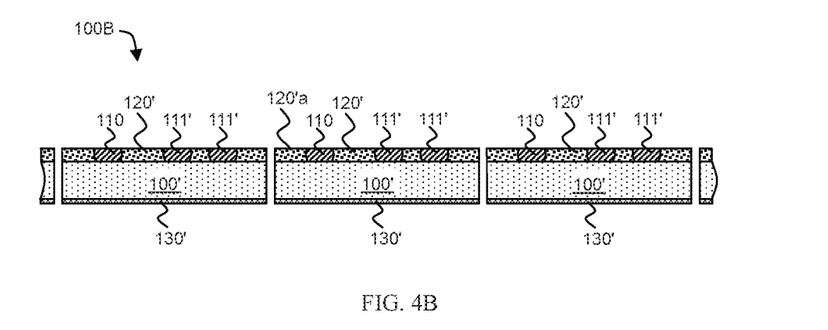
Figure 4C:
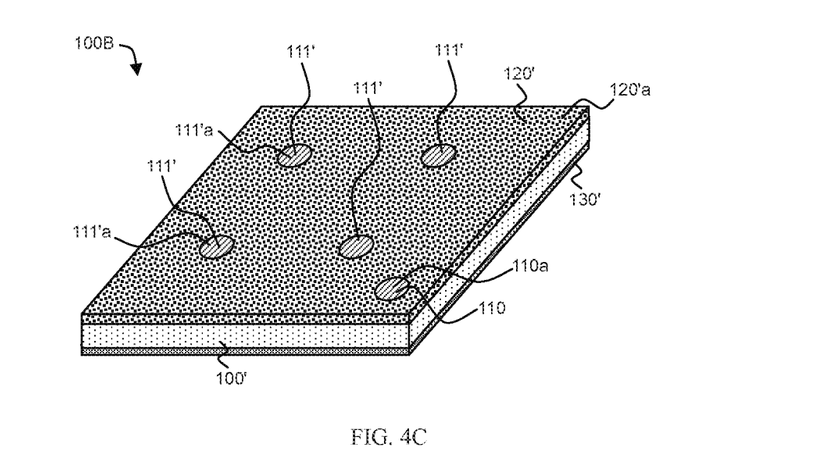
FIG. 4C is a perspective view of a chip package made by the alternating method described in FIGS. 4A-4B.

In an alternative embodiment, as shown in FIGS. 4A to 4C, instead of depositing one big solder ball 111, multiple separated smaller solder balls 111' (as shown in FIG. 4A) are deposited on the metal pad 100'b of each chip 100'. The volume of the solder ball 111' can be the same as or different from that of the solder ball 110. The chip package 100B in FIG. 4B-4C is manufactured similar to the chip package 100A as described above in FIGS. 2A to 2I, except that the big solder ball 111 is replaced by multiple smaller solder balls 111', and after the compression step shown in FIGS. 2C-2D, the top surface 110a of the solder ball 110 and the top surface 111'a of the solder balls 111' are co-planar. Similar to chip package 100A shown in FIG. 2J, the chip package 100B is attached on a die paddle 150 of a lead frame and the solder balls are electrically connected to pins 150a, 150b arranged near the die paddle via metal clips 140a, 140b, excepting that the structure of the metal clip 140b, which connects the smaller solder ball 111' to the pin 150b of the lead frame, can be slightly adjusted, for example the metal clip 140b includes multiple contacts (not shown), each of which is connected to a solder ball 111' correspondingly, thus all solder balls 111' are electrically connected to the pin 150b via the metal clip 140b. In the chip package 100A or chip package 100B, when the chip 100' operates normally, there is a high current from the metal pad 100'b used as the source electrode to the bottom metal layer 130' used as drain electrode, therefore it is required either a big volume solder ball with large contact area at the die surface or a plurality of smaller solder balls with large total contact area at various locations at the die surface to reduce metal spreading resistance and carry the high current.

Figure 5A:
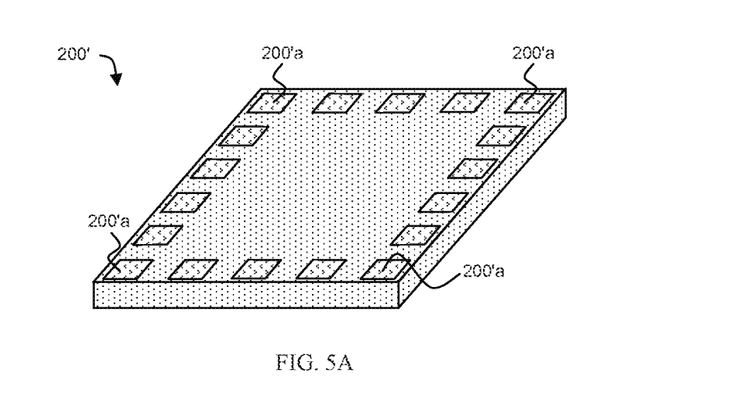
FIG. 5A is a perspective view of an integrated circuit power device.
Figure 5B:
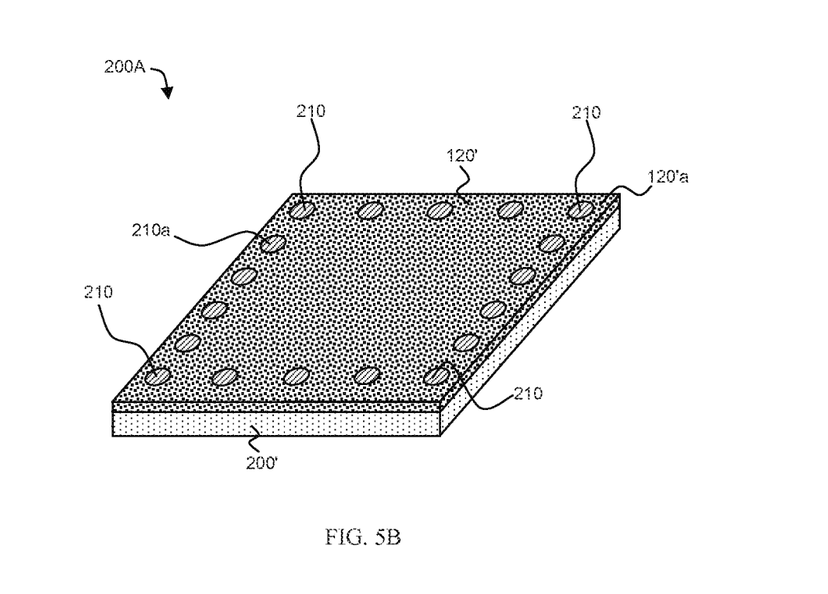
FIG. 5B is a perspective view of a chip package of the IC power device of FIG. 5A.

In another embodiment, as shown in FIGS. 5A to 5B, the semiconductor chip 200' is not a vertical MOSFET 100' as shown in FIG. 3A, but is an integrated circuit power device. As shown in FIG. 5A, a plurality of metal pads 200'a arranged at the front surface of the chip 200', usually distributed along the edges of the chip 200'. The area of different metal pads 200'a maybe equal to or slightly different from each other, and one solder ball 210 can be correspondingly attached on each metal pad 200'a with the volume of all the solder balls being the same. For an IC power device, the back of the chip 200' usually has no electrode, therefore, during manufacturing process of the chip package 200A in FIG. 5B, the step of thinning the wafer as shown in FIG. 2H is optional. The chip package 200A comprises a chip 200' with its front surface covering by a molding layer 120' and multiple solder balls 210 attached on the metal pads 200'a at the front surface of the wafer 200', where the top surfaces 210a of all of the solder balls 210 are exposed from the molding layer 120'.

Typical embodiments of specific structures for detailed modes are given out through explanations and drawings, for example, this scheme directly attaches solder balls on the metal pads of the chip, and then applies pressure to the solder ball. However, it is well known in the art that the metal pads arranged around the edge of the top surface of the chip can be re-arranged through redistribution layer (RDL) technology as matrix arrangement of other models with the re-distributed metal pads formed in a polyimide layer that covers on the top surface of the chip. Based on the spirit of the present invention, the solder balls can also be attached on the re-distributed metal pads, and then pressure is applied to the solder balls, while the molding compound is deposited on the polyimide layer.

Although the invention discloses the current preferable embodiments, the contents are not limitations. Various changes and corrections are undoubtedly obvious after the technical personnel of the field reading the specification. Therefore, the attached claims are considered to be all the changes and corrections covering the true concept and scope of the invention. Any and all equivalent scopes and contents within the claims are deemed to be within the intention and scope of the invention.

The invention claimed is:
1. A method for packaging an ultra-thin chip with solder ball thermo-compression in wafer level packaging process, comprising:
depositing multiple solder balls correspondingly on multiple metal pads arranged on a front surface of semiconductor chips formed on a top surface of a semiconductor wafer and spaced apart from each other by a scribe line;
heating the semiconductor wafer to soften the solder balls;
placing a compression plate above or on top of the solder balls and moving the compression plate towards the top surface of the wafer, ensuring that a surface of the compression plate adjacent to the top surface of the wafer is kept in parallel to the top surface of the wafer to effect a compression process, forming a co-planar top flat surface of the top of the solder balls;

forming a molding layer covering a front surface of the semiconductor wafer and surrounding the solder balls with the top of the solder balls exposed from the molding layer by:
a) placing a molding compound, in powder form or liquid form, onto the top surface of the wafer;
b) placing a release tape on top of the molding compound and the wafer;
c) heating the molding compound above the melting temperature of the molding compound without melting the solder balls;
d) applying a pressure on the release tape to make the release tape closely contacting the top of the solder balls and closely contacting the molding compound whereby forming the molding compound into the molding layer albeit having the following concomitant residual process-induced artifacts:
   d1) the solder balls containing a bump slightly higher than the top of the molding layer; and
   d2) an overflow of a melted molding compound covering a portion of the top of the solder balls; and
e) removing the release tape from the top of the molding layer and from the top of the solder balls thus revealing the residual process-induced artifacts; and
f) lightly grinding or polishing or brushing the top of the molding layer thereby removing the residual process-induced artifacts;
grinding a bottom surface of the semiconductor wafer to reduce its thickness; and
cutting the semiconductor wafer and the molding layer at the scribe line to separate individual chip packages, each of which includes a semiconductor chip and a molding layer covering the front surface of the semiconductor chip and surrounding the solder balls with the top of the solder balls exposed from the molding layer.

2. The method of claim 1, wherein during heating the semiconductor wafer to soften the solder balls, the heating temperature is lower than the melting point of the solder ball.

3. The method of claim 2, wherein during heating the semiconductor wafer, the heating temperature is 10° C. to 100° C. lower than the melting point of the solder ball.

4. The method of claim 1 wherein the wafer is heated from its bottom surface, top surface or both surfaces to soften the solder balls.

5. The method of claim 1, wherein the compression plate is heated before applying a pressure on the compression plate to the top of the solder balls.

6. The method of claim 1, wherein the compression plate is a stainless steel plate, a copper plate, a ceramic plate or a marble plate.

7. The method of claim 1, wherein during applying a pressure on the compression plate to the top of the solder balls, the compression plate is slowly moved down with a speed of 0.01 mm/min to 10 mm/min.

8. The method of claim 7, wherein during applying a pressure on the compression plate to the top of the solder balls, the compression plate is slowly moved down with a speed of 0.2 mm/min.

9. The method of claim 1, wherein after forming a molding layer covering a front surface of the semiconductor wafer and surrounding the solder balls, the solder balls and the molding layer have flat top surfaces.

10. The method of claim 9, after forming a molding layer covering a front surface of the semiconductor wafer and surrounding the solder balls, further comprising grinding, polishing or brushing the top of the solder balls to clean and remove the residue of the molding compound from the top of the solder balls.

11. The method of claim 1, after grinding a bottom surface of the semiconductor wafer, forming a metal layer covering the bottom surface of the thinned semiconductor wafer, wherein the metal layer is also cut during cutting the semiconductor wafer and the molding layer at the scribe line.

12. The method of claim 1, wherein the metal pads arranged at the front surface of the semiconductor chip have bigger and smaller areas, and wherein the solder ball attached to those metal pads of bigger area has a bigger volume than the solder ball attached to those metal pads of smaller area.

13. The method of claim 1, wherein the metal pads arranged at the front surface of the semiconductor chip have bigger and smaller areas, and wherein the number of solder balls of the same volume attached to those metal pads of bigger area is higher than the number of solder balls of the same volume attached to those metal pads of smaller area.

14. The method of claim 1, wherein the semiconductor chip is a metal-oxide-semiconductor field-effect transistor (MOSFET).

* * * * *